(12) United States Patent
Moyer et al.

(10) Patent No.: US 7,266,848 B2
(45) Date of Patent: Sep. 4, 2007

(54) INTEGRATED CIRCUIT SECURITY AND METHOD THEREFOR

(75) Inventors: William C. Moyer, Dripping Springs, TX (US); Michael D. Fitzsimmons, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 941 days.

(21) Appl. No.: 10/100,462

(22) Filed: Mar. 18, 2002

(65) Prior Publication Data

US 2003/0177373 A1 Sep. 18, 2003

(51) Int. Cl.
*G06F 21/00* (2006.01)
(52) U.S. Cl. .......................................... 726/29; 713/194
(58) Field of Classification Search .................. 726/29, 726/34; 713/194
See application file for complete search history.

(56) References Cited

U.S. PATENT DOCUMENTS

| | | | |
|---|---|---|---|
| 5,465,349 A | | 11/1995 | Geronimi et al. |
| 5,594,227 A | * | 1/1997 | Deo .......................... 235/380 |
| 5,671,394 A | | 9/1997 | Katsuta |
| 5,704,039 A | | 12/1997 | Yishay |
| 5,784,577 A | * | 7/1998 | Jacobson et al. ........... 710/104 |
| 5,978,937 A | * | 11/1999 | Miyamori et al. ............ 714/45 |
| 5,991,880 A | * | 11/1999 | Curd et al. .................... 726/28 |
| 6,076,149 A | | 6/2000 | Usami |
| 6,158,032 A | * | 12/2000 | Currier et al. ............... 714/726 |
| 6,189,109 B1 | * | 2/2001 | Sheikh et al. ................... 714/1 |
| 6,622,208 B2 | * | 9/2003 | North .......................... 711/118 |
| 6,957,340 B1 | * | 10/2005 | Pang et al. .................. 713/189 |
| 2003/0005335 A1 | * | 1/2003 | Watanabe .................... 713/202 |

FOREIGN PATENT DOCUMENTS

WO WO 01/57627 A2 8/2001

OTHER PUBLICATIONS

DSM2150F5, www.st.com/psd, STM Microelectronics, Mar. 2002.*
PCT/US03/07839 PCT International Search Report.
Noore, "Highly Robust Biometric Smart Card Design," IEEE, Department of Computer Science and Electrical Engineering, Jul. 26, 2000, pp. 1059-1063.
Cooke, "The Use of Smart Cards in Personal Communication Systems Security," Aston University,U.K., pp. 246-251, Apr. 1993.
"IEEE Standard Test Access Port and Boundary-Scan Architecture," IEEE Std. 1149-1-2001, pp. 1-200.

* cited by examiner

*Primary Examiner*—David Y. Jung
*Assistant Examiner*—Andrew L Nalven
(74) *Attorney, Agent, or Firm*—Susan C. Hill; Joanna G. Chiu; Ranjeev Singh

(57) ABSTRACT

The invention relates to an integrated circuit (IC), and more particularly to security to protect an IC (10) against unauthorized accesses. In one embodiment, an identifier is provided external to IC 10. A corresponding input IC security key (52) is then provided to IC 10 and compared to a stored IC security key (30). If the input IC security key (52) and the stored IC security key (30) do not match, access to protected functional circuitry (12) is prohibited. The present invention may use any debug interface, including standard debug interfaces using the JTAG 1149.1 interface defined by the IEEE.

23 Claims, 4 Drawing Sheets

INTEGRATED CIRCUIT SECURITY AND METHOD THEREFOR

FIELD OF THE INVENTION

The present invention relates to an integrated circuit, and more particularly to security for an integrated circuit.

RELATED ART

Security for integrated circuits is becoming increasingly important as integrated circuits are being used in more and more security conscious applications. Some examples of such applications are smart cards, cellular telephones, internet communication devices, etc. In particular, it is often desirable to provide security against fraudulent or unauthorized access to one or more portions of the integrated circuit. Many integrated circuits include terminals that may be used to input and/or output information to/from the integrated circuit. Such input/output terminals may provide a path for unauthorized access to one or more portions of the integrated circuit. In addition, some input/output terminals to an integrated circuit may be used for debug, emulation, and/or testing purposes and may also provide a path for unauthorized access to one or more portions of the integrated circuit.

One common standard used for integrated circuit debug, emulation, and/or testing purposes is the well known JTAG (Joint Test Action Group) IEEE (Institute of Electrical and Electronic Engineers) 1194.1 test access port and boundary scan architecture. In addition to the standard JTAG interface, there are a wide variety of other debug, emulation, and/or test interfaces used for integrated circuits.

In systems which utilize debug, emulation, or test interfaces, unauthorized access to internal IC resources must be prevented in order to secure such resources. Thus, what is needed is a method for providing security against unauthorized access, while continuing to provide debug, emulation and test capability for the IC device.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The terms "assert" and "negate" is used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. The term "debug" as used herein is meant in a very encompassing sense and will include emulation and test functions as well.

Figure 1:
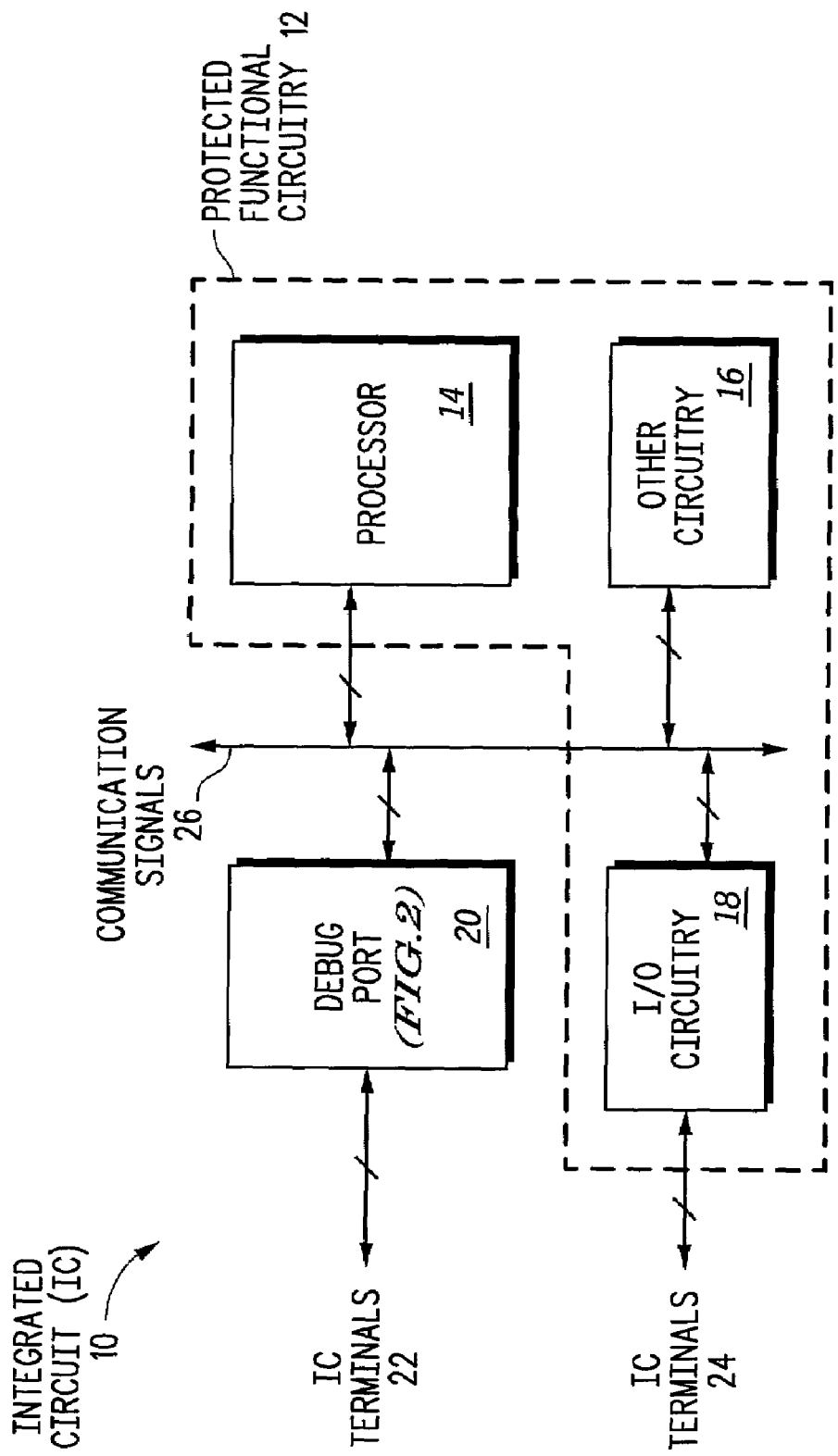
FIG. 1 illustrates, in block diagram form, an integrated circuit 10 in accordance with one embodiment of the present invention.

FIG. 1 illustrates, in block diagram form, an integrated circuit (IC) 10 in accordance with one embodiment of the present invention. In one embodiment, IC 10 includes a debug port 20 and protected functional circuitry 12. In one embodiment, protected functional circuitry 12 includes a processor 14, other circuitry 16, and input/output (I/O) circuitry 18 which are bi-directionally coupled to each other and to debug port 20 by way of communication signals 26. In one embodiment, processor 14 may be a processor which executes instructions of any type, for example, a central processing unit, a digital signal processor, a timer processing unit, etc. In one embodiment, other circuitry 16 may be circuitry that performs one or more of the intended functions of IC 10, but which does not necessarily require the execution of instructions to perform the intended function, for example, an MPEG encoder, decoder, image processing unit, or a hardwired data processing element. Alternate embodiments of protected functional circuitry 12 may include only processor 14, only other circuitry 16, or both processor 14 and other circuitry 16. In one embodiment, I/O circuitry 18 is coupled to one or more IC terminals 24 in order to communicate to circuitry (not shown) external to IC 10. In alternate embodiments of the present invention, I/O circuitry 18 may include any type of external bus structure, including a data/address/control bus structure. Yet other embodiments of IC 10 may not even have I/O circuitry 18 and IC terminals 24, for example, an IC 10 that operates in a single chip mode having no external bus. In one embodiment of the present invention, debug port 20 is bidirectionally coupled to one or more IC terminals 22 which allows debug port 20 to communicate with devices (not shown) which are external to IC 10.

Figure 2:
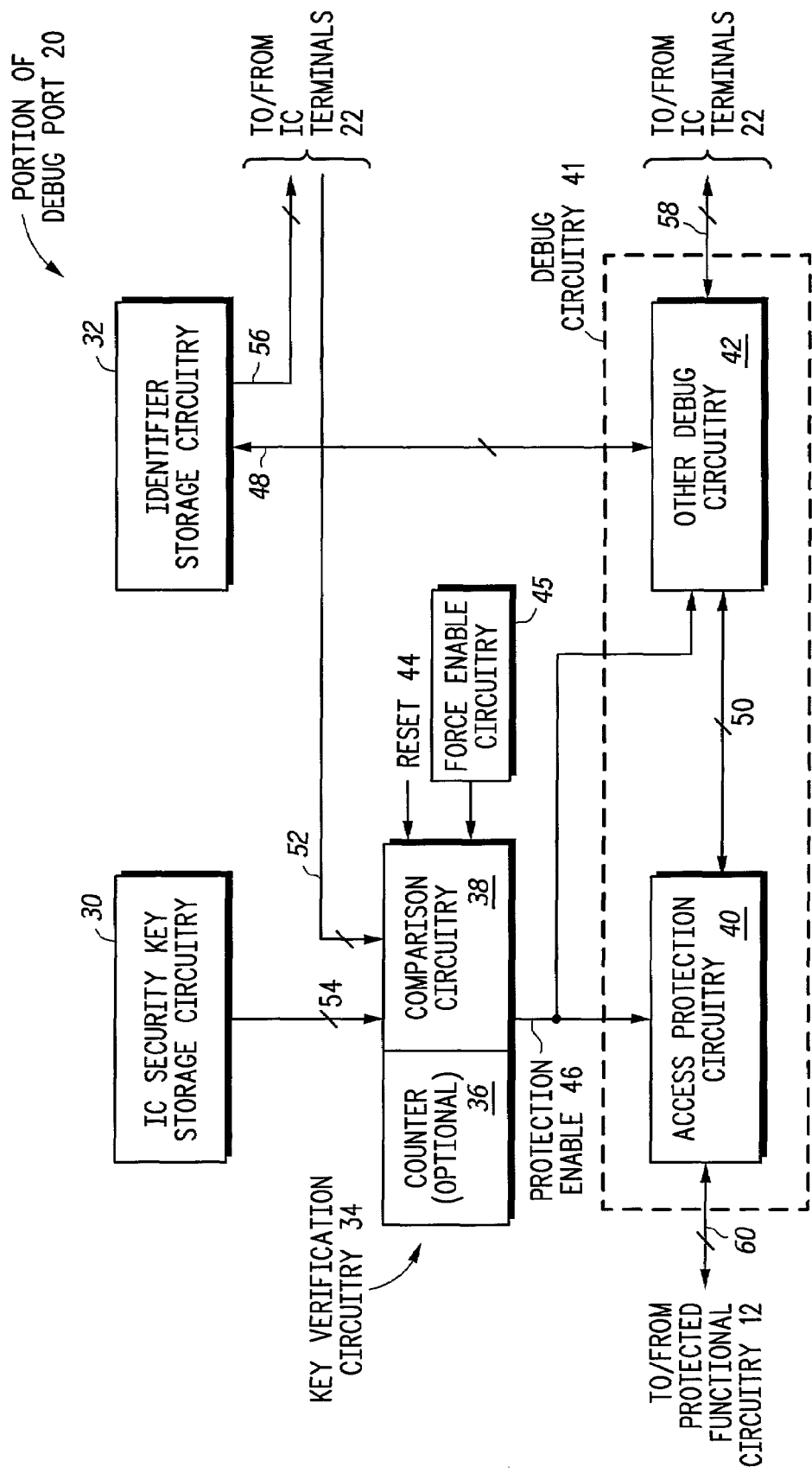
FIG. 2 illustrates, in block diagram form, a portion of debug port 20 of FIG. 1 in accordance with one embodiment of the present invention.

FIG. 2 illustrates, in block diagram form, a portion of debug port 20 of FIG. 1 in accordance with one embodiment of the present invention. In one embodiment, debug port 20 includes debug circuitry 41 which is bidirectionally coupled to IC terminals 22 by way of signals 58 in order to receive and/or provide one or more debug signals to/from devices (not shown) which are external to IC 10. Debug circuitry 41 includes other debug circuitry 42 which is bi-directionally coupled to access protection circuitry 40 by way of signals 50. Other debug circuitry 42 provides one or more signals 48 to identifier storage circuitry 32 to indicate when identifier storage circuitry 32 is to provide the stored identifier value external to IC 10 by way of one or more conductors 56 and one or more terminals 22. Alternatively, debug circuitry 41 may receive a stored identifier value from identifier storage circuitry 32 by means of signals 48, and may provide the stored identifier value external to IC 10 by way of one or more conductors 58 and one or more terminals 22. Access protection circuitry 40 is bi-directionally coupled to protected functional circuitry 12 by way of conductors 60 to transfer information which may be used for debug purposes.

In one embodiment of the present invention, the identifier value stored in identifier storage circuitry 32 is unique to each integrated circuit 10 that is manufactured. However, alternate embodiments may use any desired mapping between identifier values and ICs; a unique mapping, such as a 1:1 mapping, may not be desired for some embodiments. The identifier value may be stored in one-time programmable non-volatile storage circuits, such as fuses, may be mask programmed, or may be provided by logic external to debug port 20. The identifier value may be used to track an IC for a variety of purposes, as well as providing an identifier value external to IC 10. The manufacturer of IC 10 may keep a confidential list of identifier values and corresponding IC security key values external to IC 10. Meanwhile, each IC 10 also stores the both the identifier (in identifier storage circuitry 32) and the stored IC security key (in IC security key storage circuitry 30).

When an allowed debug device (not shown) external to IC 10 receives the identifier value from IC 10 by way of terminals 22, it checks the confidential list of identifier values and corresponding IC security key values in order to determine the proper input IC security key value to input to IC 10 by way of IC terminals 22 and one or more conductors 52. Note that the length of the identifier may be selected to be any appropriate length, as long as there are a sufficient number of bits to make the desired mapping to individual ICs. Similarly, the length of the IC security key may be any appropriate length, as long as there is a sufficient number of bits to prevent trial and error from allowing unauthorized access to protected functional circuitry 12. In one embodiment, the length of the identifier is 16 bits and the length of the IC security key is 48 bits. Alternate embodiments of the current invention may not require provision of identifier values, and may therefore not contain identifier storage circuitry 32.

In one embodiment, debug port 20 includes IC security key storage circuitry 30 which provides a stored IC security key to comparison circuitry 38 by way of one or more signals 54. In one embodiment, key verification circuitry 34 optionally includes counter circuitry 36, as well as comparison circuitry 38. In alternate embodiments of the present invention, counter 36 may be used to prevent negation of protection enable signal 46. In one embodiment of the present invention, counter 36 may prevent negation of protection enable signal 46 if a predetermined time has elapsed after a preselected event. Although the preselected event may be any desired event, some possible events are the assertion of reset 44, and alternately the reception of a first input IC security key from IC terminals 22. In some embodiments, if the comparison does not result in a match within a predetermined window of time, access to the protected functional circuitry 12 is not enabled. In alternate embodiments, counter 36 may count the number of unsuccessful comparisons that are performed by comparison circuitry 38 and may prevent negation of protection enable signal 46 if a predetermined number of unsuccessful comparisons have been performed since the last assertion of reset signal 44. In one embodiment of the present invention, protection enable signal 46 is initialized to the asserted state upon power-up or resetting of key verification circuitry 34 in order to prevent access to protected functional circuitry 12. In other embodiments, protection enable signal 46 may be asserted by other events internal to or external to IC 10.

In one embodiment of the present invention, key verification circuitry 34 receives an input IC security key which has been received from external to IC 10 by way of one or more IC terminals 22 and one or more conductors 52.

Comparison circuitry 38 then compares the input IC security key received from terminals 22 to the stored IC security key stored in circuitry 30. Comparison circuitry 38 receives the stored IC security key stored from circuitry 30 by way of conductors 54. In one embodiment of the present invention, comparison circuitry 38 performs a bit-wise comparison as each bit of the input IC security key is received by comparison circuit 38. Alternate embodiments of the present invention may temporarily store the input IC security key and then perform the comparison with the stored IC security key once all the bits of the input IC security key have been received.

If the input IC security key matches the stored IC security key, comparison circuitry 38 negates the protection enable signal 46. Negation of the protection enable signal 46 causes the access protection circuitry 40 to allow access to protected functional circuitry 12 by way of other debug circuitry 42. In some embodiments of the present invention, assertion of the protection enable signal 46 causes one or more portions of other debug circuitry 42 to be disabled, while other portion of debug circuitry 42 remain enabled independent of the state of the protection enable signal 46.

In some embodiments of the present invention, force enable circuitry 45 may be used to override the function of the comparison circuitry 38 and force the protection enable signal 46 to be negated, regardless of the values of the input IC security key and the stored IC security key. One possible use of the force enable circuitry 45 is to force the debug circuitry 41 to be enabled during manufacturer debugging and testing of IC 10. Once the design of the circuitry on IC 10 has been verified, force enable circuitry 45 may be permanently disabled so that key verification circuitry 34 may never again be bypassed. One way to implement this may be to use one or more one-time programmable non-volatile storage circuits, such as fuses. For example, in one embodiment, blowing one or more fuses within force enable circuitry 45 may cause force enable circuitry 45 to no longer override key verification circuitry 34.

In some embodiments of the present invention, reset signal 44 is provided to key verification circuitry 34 and other portions of IC 10. Reset signal 44 must then be asserted by reset assertion circuitry in other circuitry 16 (see FIG. 1) or circuitry internal to or external to IC 10 in order to reset all or a portion of IC 10. In some embodiments, comparison circuitry 38 is disabled and no more comparisons are allowed after counter 36 (optional) has determined that a predetermined time has elapsed or a predetermined number of attempts have been made. Reset signal 44 may optionally be used by key verification circuitry to reset counter 36 and/or to enable comparison circuitry 38 to begin or resume performing comparisons.

Other debug circuitry 42 may include circuitry which implements one or more standard debug, emulation, or test interfaces and protocols, such as, for example, a JTAG interface and protocol. In one embodiment, IC terminals 22 may include JTAG TDO (test data out) and TDI (test data in) signals. For some embodiments of the present invention, the protection enable signal 46 does not affect selected JTAG functions performed by other debug circuitry 42. This allows other debug circuitry 42 to perform in a JTAG compliant manner even when the protection enable signal 46 is asserted and thus preventing access by debug circuitry 41 to protected functional circuitry 12.

Note that in some embodiments of the present invention, one of IC terminals 22 may be used as a debug IC terminal which provides the input IC security key to comparison circuitry 38 by way of signals 52 and also acts as a debug IC terminal to communicate with protected functional circuitry 12 by way of debug circuitry 41. In some embodiments of the present invention, signal 52 and one or more of signals 58 and 60 may be the JTAG TDI signal.

Similarly, in some embodiments of the present invention, one of the IC terminals 22 may be used as a debug IC terminal which provides the identifier value from circuitry 32 to circuitry external to IC 10 (not shown) by way of signals 56. This same one of the IC terminals 22 may also act as a debug IC terminal to communicate from protected functional circuitry 12 to other circuitry external to IC 10 (not shown) by way of access protection circuitry 40. In one embodiment, signal 56 and one or more of signals 58 and 60 may be the JTAG TDO signal.

Figure 3:
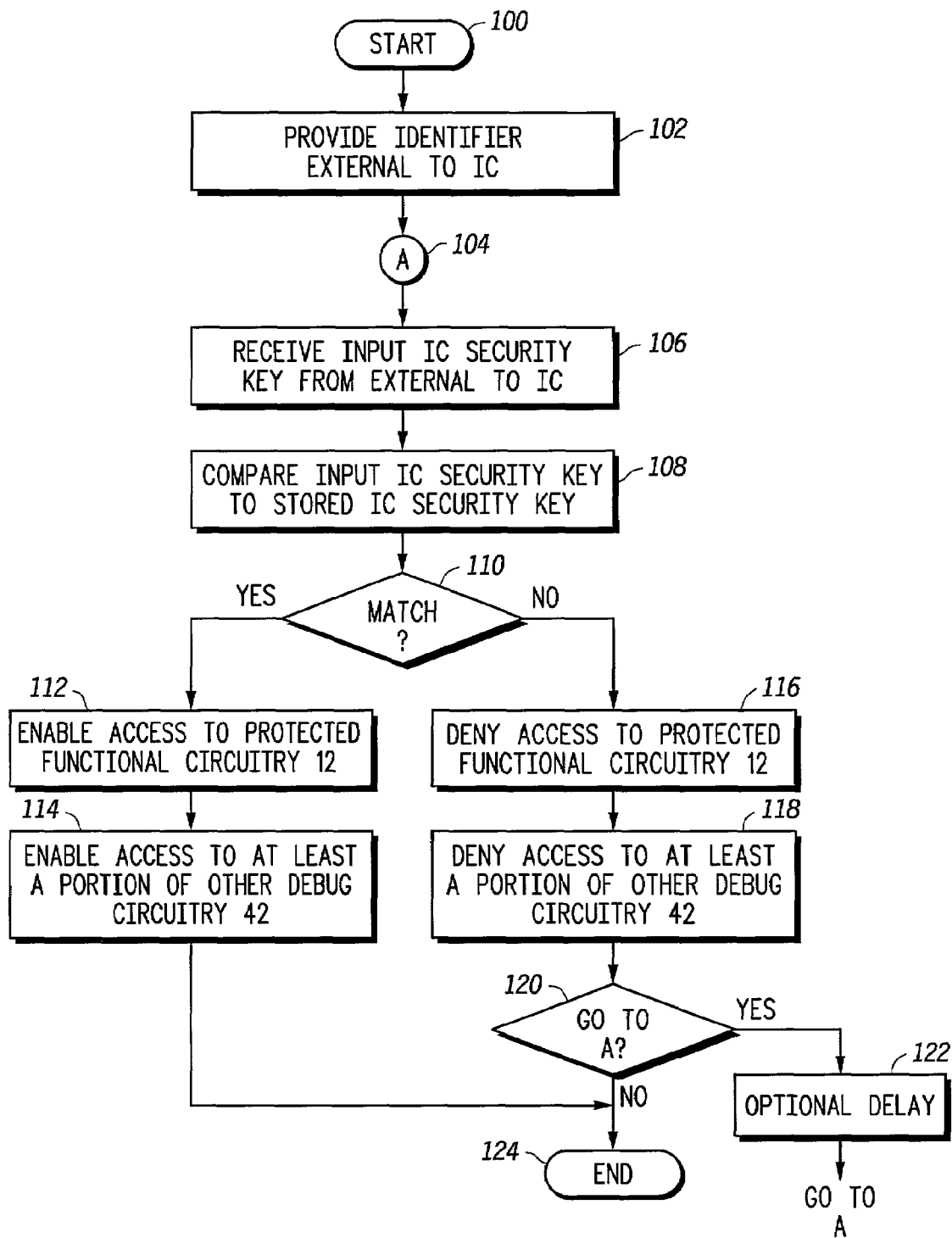
FIG. 3 illustrates, in flow diagram form, a method for providing security in an integrated circuit in accordance with one embodiment of the present invention.

FIG. 3 illustrates, in flow diagram form, a method for providing security in an integrated circuit in accordance with one embodiment of the present invention. In one embodiment, the flow of FIG. 3 may be used to provide security for IC 10 of FIG. 1. From start oval 100, the flow in FIG. 3 proceeds to step 102 where an identifier is provided external to the IC. Step 102 proceeds to step 106 by way of circle A 104. Step 106 receives an input IC security key from external to the IC. From step 106, the flow proceeds to step 108 where the input IC security key is compared to the stored IC security key. From step 108, the flow proceeds to decision diamond 110 where it is determined whether or not a match has occurred between the input IC security key and the stored IC security key.

If a match has occurred, the flow continues to optional step 112 where access to protected functional circuitry 12 is enabled. From step 112, the flow proceeds to optional step 114 where access to at least a portion of other debug circuitry 42 is enabled. Note that alternate embodiments of the present invention may skip optional step 114 and may not use the result of the match to affect any circuitry in other debug circuitry 42. From step 114, the flow proceeds to oval 124 where the flow ends.

If a match has not occurred at decision diamond 110, the flow continues to step 116 where access to protected functional circuitry 12 is denied. From step 116, the flow proceeds to optional step 118 where access to at least a portion of other debug circuitry 42 is denied. Note that alternate embodiments of the present invention may skip optional step 118 and may not use the result of the match to affect any circuitry in other debug circuitry 42. Alternately, one or more portions of other debug circuitry 42 may remain continuously enabled and thus may not be affected by protection enable signal 46. From step 118, the flow proceeds to decision diamond 120 which checks to see if it is allowed to receive and evaluate another input IC security key. If it is not allowed to receive and evaluate another input IC security key, then the flow proceeds to oval 124 where the flow ends. However, if it is allowed to receive and evaluate another input IC security key, then the flow proceeds to step 122 where an optional delay may be selectively inserted. Providing an optional delay may be beneficial in limiting the number of attempts to thwart the security mechanisms provided by the current invention, while allowing for legitimate opportunities to correct an incorrect entry. The length of the optional delay may be determined in any appropriate manner. Some embodiments may dispense with optional delay step 122. From step 122, the flow proceeds to circle A 104 so that another input security key may be received. Alternate embodiments may provide a limit on the number of attempts to enter an input IC security key by modifying decision diamond 120. Decision diamond 120 may be based on counting the number of attempts at entry and comparing the number of attempts with a predetermined threshold, and if the number of attempts equals or exceeds the threshold, denying a return to circle A 104. In other embodiments, decision diamond 120 may be based on any other value, algorithm, or state internal to or external to IC 10.

Figure 4:
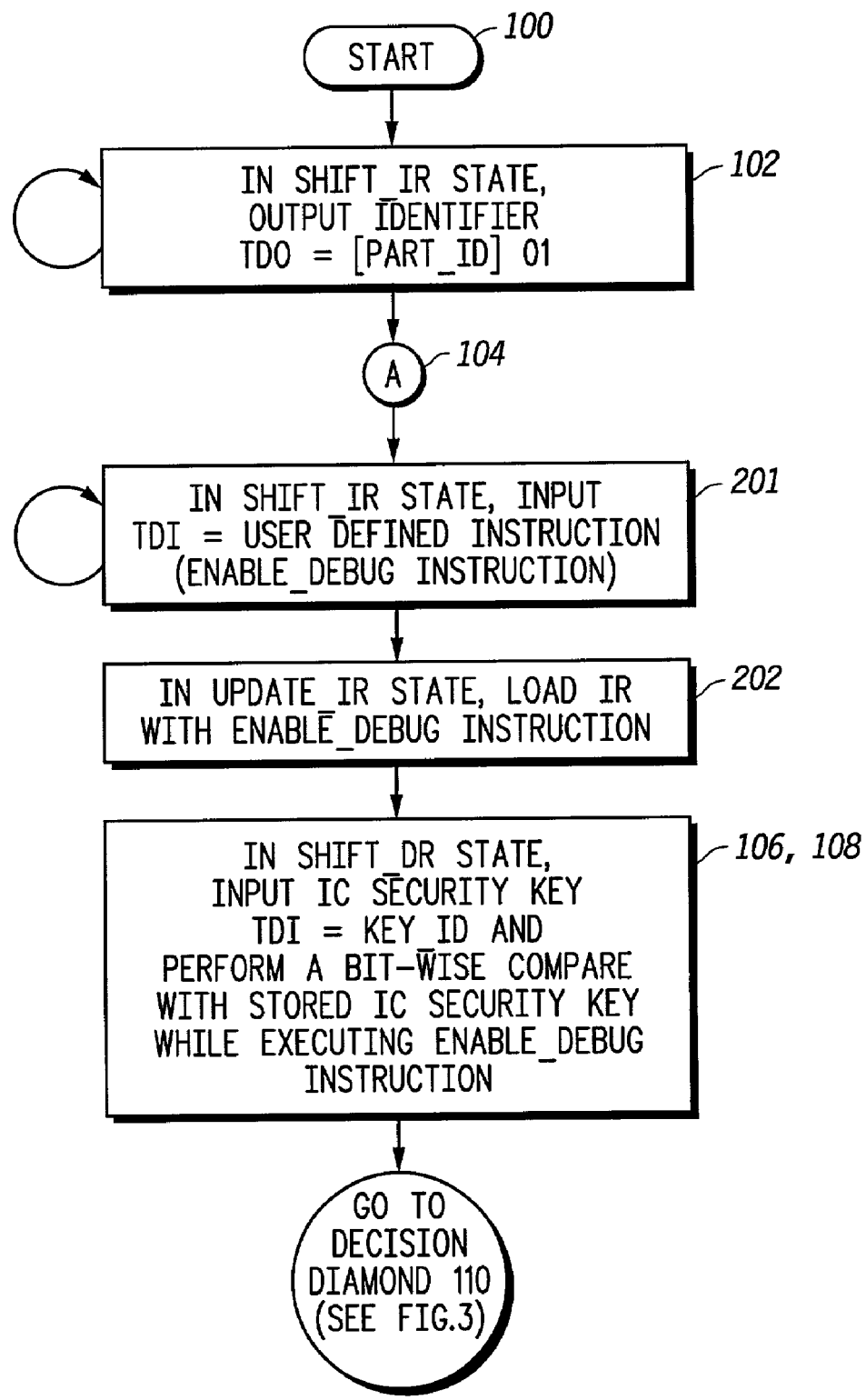
FIG. 4 illustrates, in flow diagram form, a method for providing security in an integrated circuit in accordance with an alternate embodiment of the present invention.

FIG. 4 illustrates, in flow diagram form, a method for providing security in an integrated circuit in accordance with an alternate embodiment of the present invention. In one embodiment, the flow of FIG. 4 may be used to provide security for IC 10 of FIG. 1, where IC 10 uses a JTAG test access port to provide for receiving an input IC security key. FIG. 4 uses the same reference numbers as FIG. 3 when the step performed in FIG. 4 performs the same function as the corresponding step in FIG. 3. Compared to the flow in FIG. 3, the flow in FIG. 4 gives more details regarding one embodiment of the present invention which utilizes a JTAG test access port and boundary scan architecture.

From start oval 100, the flow in FIG. 4 proceeds to step 102 where the JTAG state machine is placed in the SHIFT_IR state and an identifier (PART_ID) is output on the TDO signal during subsequent clock cycles while remaining in this state. In one embodiment, the TDO signal provides the identifier (PART_ID) concatenated with a binary 01 in a serial fashion during the SHIFT_IR state. The TDO signal is provided external to the IC. Step 102 proceeds to step 201 by way of circle A 104. In step 201, while the JTAG state machine remains in or is again placed in the SHIFT_IR state, a binary representation of a user defined instruction, such as an ENABLE_DEBUG instruction, is input on the TDI signal. From step 201, the flow proceeds to step 202 where the JTAG state machine is placed in the UPDATE_IR state and the JTAG IR (instruction register) is loaded with the binary representation of the ENABLE_DEBUG instruction. From step 202, the flow proceeds to step 106, 108 where the ENABLE_DEBUG instruction is executed. During step 106, 108 an input IC security key is received from external to the IC. As the bits of the input IC security key are received, they are compared in a bit-wise manner to the stored IC security key. Alternate embodiments of the present invention may instead temporarily store the input IC security key until all bits have been received so that a comparison may be done in a parallel manner. From step 106, 108, after a comparison of the complete input IC security key to the stored IC security key is complete, the flow proceeds in a similar manner to the flow of FIG. 3 at decision diamond 110.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. For example, although the invention has been described in the context of securing against unauthorized access to an IC 10 from sources external to IC 10, alternate embodiments of the present invention may protect one or more portions of circuitry on an IC 10 from access by other unauthorized portions of circuitry on the same IC 10.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for providing security in an IC having protected functional circuitry, said method comprising:
   providing, from the IC, an IC identifier;
   in response to providing said IC identifier, receiving at the IC an input IC security key, wherein the input IC security key is provided by a debug device external to the IC, and wherein the debug device prior to providing the input IC security key evaluates a set of IC identifiers and corresponding IC security key values to determine the input IC security key;
   comparing, in the IC, the input IC security key to a stored IC security key; and
   selectively enabling access to the protected functional circuitry in the IC in response to said step of comparing.

2. The method of claim 1, wherein selectively enabling comprises:
   if the input IC security key and stored IC security key match, enabling access to the protected functional circuitry; and
   if the input IC security key and stored IC security key do not match, denying access to the protected functional circuitry.

3. The method of claim 2, further comprising:
   if the input IC security key and stored IC security key do not match, waiting a predetermined amount of time prior to comparing a second input IC security key received via at least one IC terminal to the stored IC security key.

4. The method of claim 2, further comprising:
   if the input IC security key and stored IC security key do not match, receiving a second input IC security key via at least one IC terminal in response to a reset signal.

5. The method of claim 1, wherein if the step of comparing does not result in a match of the input IC security key and stored IC security key within a predetermined window of time, access to the protected functional circuitry is not enabled, and wherein a beginning of the predetermined window of time is independent of reset.

6. The method of claim 1, wherein the IC identifier is provided by the IC via at least one IC terminal, and wherein the input IC security key is received by the IC via said at least one IC terminal.

7. The method of claim 6, wherein said at least one IC terminal comprises a JTAG terminal.

8. The method of claim 1, further comprising forcing access to the protected functional circuitry regardless of a value of the input IC security key.

9. The method of claim 8, wherein said step of forcing comprises providing a force enable value stored in the IC.

10. A method for providing security in an IC having protected functional circuitry and a JTAG interface, said method comprising:
    in a first JTAG state, receiving a user defined instruction via the JTAG interface;
    in a second JTAG state, receiving an input IC security key via the JTAG interface, wherein the input IC security key is provided by a debug device external to the IC, and wherein the debug device prior to providing the input IC security key evaluates a set of IC identifiers and corresponding IC security key values to determine the input IC security key, and comparing, in the IC, the input IC security key to a stored IC security key; and
    selectively enabling access to the protected functional circuitry in the IC via the JTAG interface.

11. The method of claim 10, wherein the first JTAG state corresponds to a SHIFT_IR state.

12. The method of claim 11, wherein the second JTAG state corresponds to a SHIFT_DR state.

13. The method of claim 10, further comprising:
    in a third JTAG state, loading an instruction register with the user defined instruction; and
    in the second JTAG state, executing the user defined instruction.

14. The method of claim 13, wherein the first JTAG state corresponds to a SHIFT_IR state, the second JTAG state corresponds to a SHIFT_DR state, and the third JTAG state corresponds to a UPDATE_IR state.

15. The method of claim 10, further comprising:
    in a third JTAG state, providing an identifier via the JTAG interface.

16. The method of claim 15, wherein the first JTAG state corresponds to a SHIFT_IR state, the second JTAG state corresponds to a SHIFT_DR state, and the third JTAG state corresponds to the SHIFT_IR state.

17. A method for providing security in an IC having protected functional circuitry, comparison circuitry, and at least one IC terminal coupled to the protected functional circuitry, said method comprising:
    providing from the IC, an IC identifier;
    in response to providing said IC identifier, receiving at the IC an input security key, wherein the input security key is provided by a debug device external to IC, and wherein the debug device prior to providing the input IC security key evaluates a set of IC identifiers and corresponding IC security key values to determine the input IC security key;
    accessing the protected functional circuitry via the at least one IC terminal;
    programming a force enable indicator to enable the comparison circuitry, wherein the comparison circuitry compares the input IC security key to a stored IC security key and, in response to comparing, selectively enables access to the protected functional circuitry via the at least one IC terminal.

18. The method of claim 17, wherein the force enable indicator comprises a fuse.

19. The method of claim 18, wherein programming the force enable indicator comprises blowing the fuse.

20. A method for providing security in an IC having protected functional circuitry, said method comprising:
    executing an instruction in the IC to provide information external to the IC;
    in response to executing the instruction in the IC to provide information external to the IC, receiving an input IC security key, wherein the input IC security key is provided by a debug device external to the IC, wherein the debug device prior to providing the input IC security key evaluates a set of IC identifiers and corresponding IC security key values to determine the input IC security key;
    comparing, in the IC, the input IC security key to a stored IC security key; and
    in response to comparing the input IC security key to a stored IC security key, selectively enabling access to the protected functional circuitry in the IC.

21. A method as in claim 20, wherein the instruction comprises a debug instruction.

22. A method as in claim 21, wherein the debug instruction comprises a JTAG instruction.

23. A method as in claim 21, wherein the debug instruction is executed in preparation for performing a debug operation.

* * * * *